United States Patent
Cao

(10) Patent No.: US 8,245,762 B2
(45) Date of Patent: Aug. 21, 2012

(54) HEAT DISSIPATION ASSEMBLY WITH PIVOTABLE DEFLECTING PLATE

(75) Inventor: Liang-Liang Cao, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 531 days.

(21) Appl. No.: 12/494,576

(22) Filed: Jun. 30, 2009

(65) Prior Publication Data

US 2010/0288475 A1     Nov. 18, 2010

(30) Foreign Application Priority Data

May 13, 2009   (CN) ...................... 2009 2 0303096 U

(51) Int. Cl.
*F28F 7/00*       (2006.01)
(52) U.S. Cl. .......... 165/80.3; 165/99; 165/121; 361/697
(58) Field of Classification Search ................. 165/80.2, 165/80.3, 104.33, 76, 96, 99; 361/697, 700; 248/200, 346.01, 346.03
See application file for complete search history.

(56) References Cited

U.S. PATENT DOCUMENTS

| | | | | |
|---|---|---|---|---|
| 4,790,374 A * | 12/1988 | Jacoby | ........................... | 165/185 |
| 6,336,620 B1 * | 1/2002 | Belli | ............................. | 248/519 |
| 7,215,548 B1 * | 5/2007 | Wu et al. | .................. | 165/104.33 |
| 7,256,993 B2 * | 8/2007 | Cravens et al. | ............... | 361/690 |
| 7,349,212 B2 * | 3/2008 | Xia et al. | ...................... | 361/697 |
| 7,382,615 B2 * | 6/2008 | Long et al. | ................... | 165/80.3 |
| 7,443,676 B1 * | 10/2008 | Li | ............................... | 165/80.3 |
| 7,443,679 B2 * | 10/2008 | Li et al. | ......................... | 361/697 |
| 7,447,028 B2 * | 11/2008 | Lai et al. | ........................ | 361/697 |
| 7,532,468 B2 * | 5/2009 | Sun et al. | ...................... | 361/690 |
| 7,663,882 B2 * | 2/2010 | Li et al. | ......................... | 361/697 |
| 7,766,074 B2 * | 8/2010 | Lin et al. | ...................... | 165/80.2 |
| 7,864,526 B2 * | 1/2011 | Liu | .......................... | 165/104.33 |
| 7,866,375 B2 * | 1/2011 | Zhou et al. | ............... | 165/104.33 |
| 7,903,415 B2 * | 3/2011 | Liu et al. | ....................... | 361/695 |
| 7,929,304 B2 * | 4/2011 | Cao et al. | ................. | 361/679.47 |
| 7,969,728 B2 * | 6/2011 | Zheng et al. | .................. | 361/697 |
| 2003/0214784 A1* | 11/2003 | Pauser | .......................... | 361/695 |
| 2006/0137861 A1* | 6/2006 | Wang et al. | ............. | 165/104.33 |
| 2007/0145572 A1* | 6/2007 | Chen et al. | .................... | 257/718 |
| 2008/0121372 A1* | 5/2008 | Zhou et al. | .................... | 165/80.3 |
| 2008/0151498 A1* | 6/2008 | Zhang | ........................... | 361/697 |
| 2009/0321047 A1* | 12/2009 | Chen | ............................. | 165/80.3 |
| 2010/0061060 A1* | 3/2010 | Tien et al. | ...................... | 361/697 |
| 2010/0172089 A1* | 7/2010 | Chiu et al. | ............... | 361/679.47 |

* cited by examiner

*Primary Examiner* — Allen Flanigan
*Assistant Examiner* — Indrajit Ghosh
(74) *Attorney, Agent, or Firm* — Altis Law Group, Inc.

(57) ABSTRACT

A heat dissipation assembly for dissipating heat from a first heat source and a second heat source includes a heat sink, a fan, a supporting member, and a deflecting panel. The heat sink includes a base and a plurality of heat dissipation fins disposed on the base. The base is in contact with the first heat source for thermally conducting the heat generated by the first heat source. The fan and the supporting member are attached at opposite sides of the heat dissipation fins. The supporting member is a pivotable rod. The deflecting plate is attached to the pivotable rod and is pivotable relative to the heat dissipation fins. The deflecting plate is capable of deflecting airflow from the fan towards the second heat source to dissipate heat generated by the second heat source.

12 Claims, 3 Drawing Sheets

HEAT DISSIPATION ASSEMBLY WITH PIVOTABLE DEFLECTING PLATE

This application is related to co-pending U.S. patent application Ser. No. 12/479,959, filed on Jun. 8, 2009, entitled "HEAT DISSIPATION APPARATUS".

BACKGROUND

1. Technical Field

The present disclosure relates to a heat dissipation assembly.

2. Description of Related Art

Electronic devices in computers, such as central processing units (CPUs), generate heat during normal operation, which can deteriorate their operational stability, and damage associated electronic devices. Thus, the heat must be removed quickly to ensure normal operation of the CPU. A typical heat dissipation assembly includes a heat sink mounted on a CPU to remove heat, and a fan fixed on the heat sink to generate airflow through the heat dissipation assembly. However, the typical heat dissipation assembly can only dissipate heat for a single heat source, and has a low efficiency.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 2:
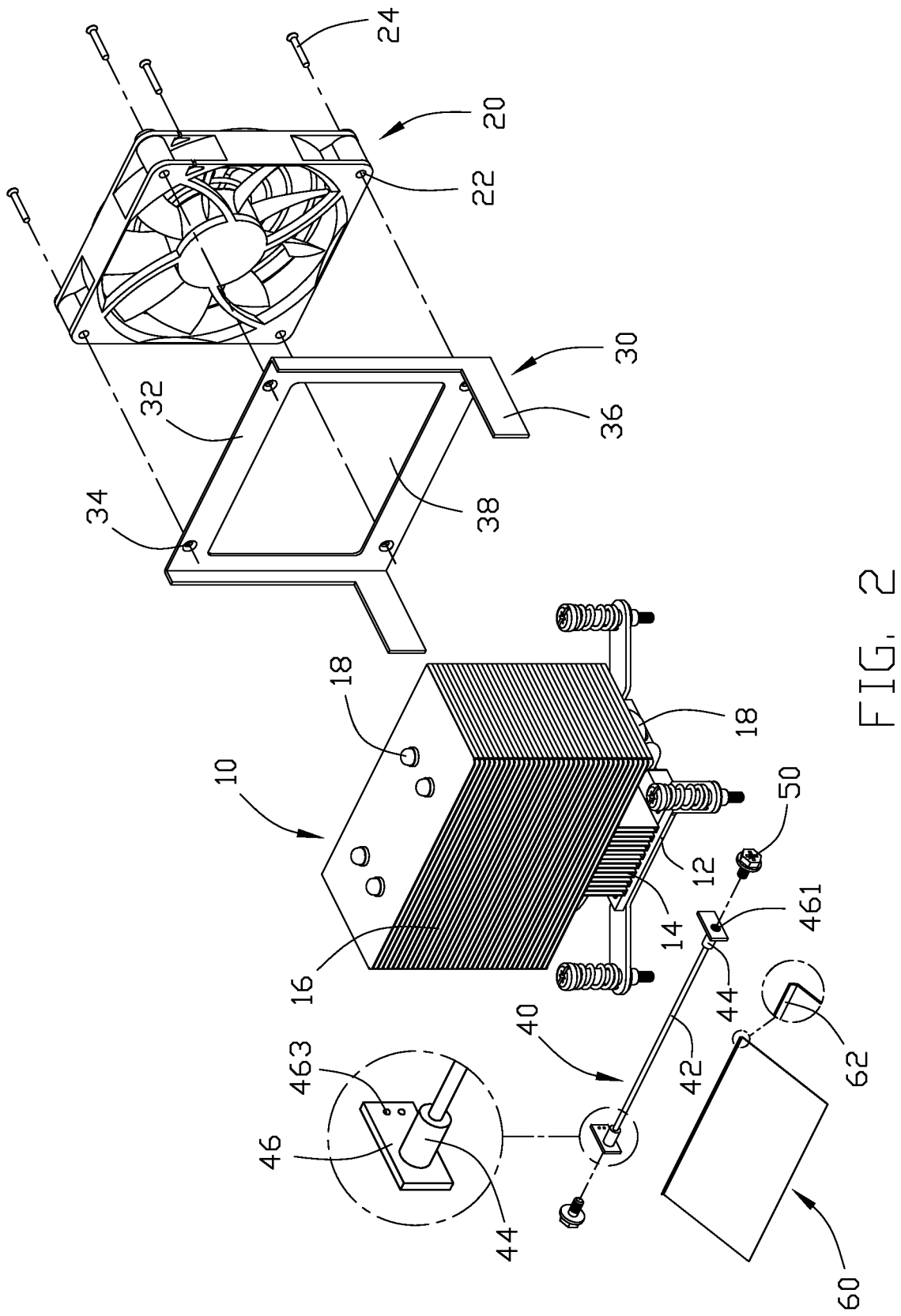
FIG. 2 is an exploded view of an embodiment of a heat dissipation assembly.

FIG. 2 is an exploded view of an embodiment of a heat dissipation assembly. The heat dissipation assembly includes a heat sink 10, a fan 20, a fan bracket 30, a supporting member 40, and a deflecting plate 60.

Figure 1:
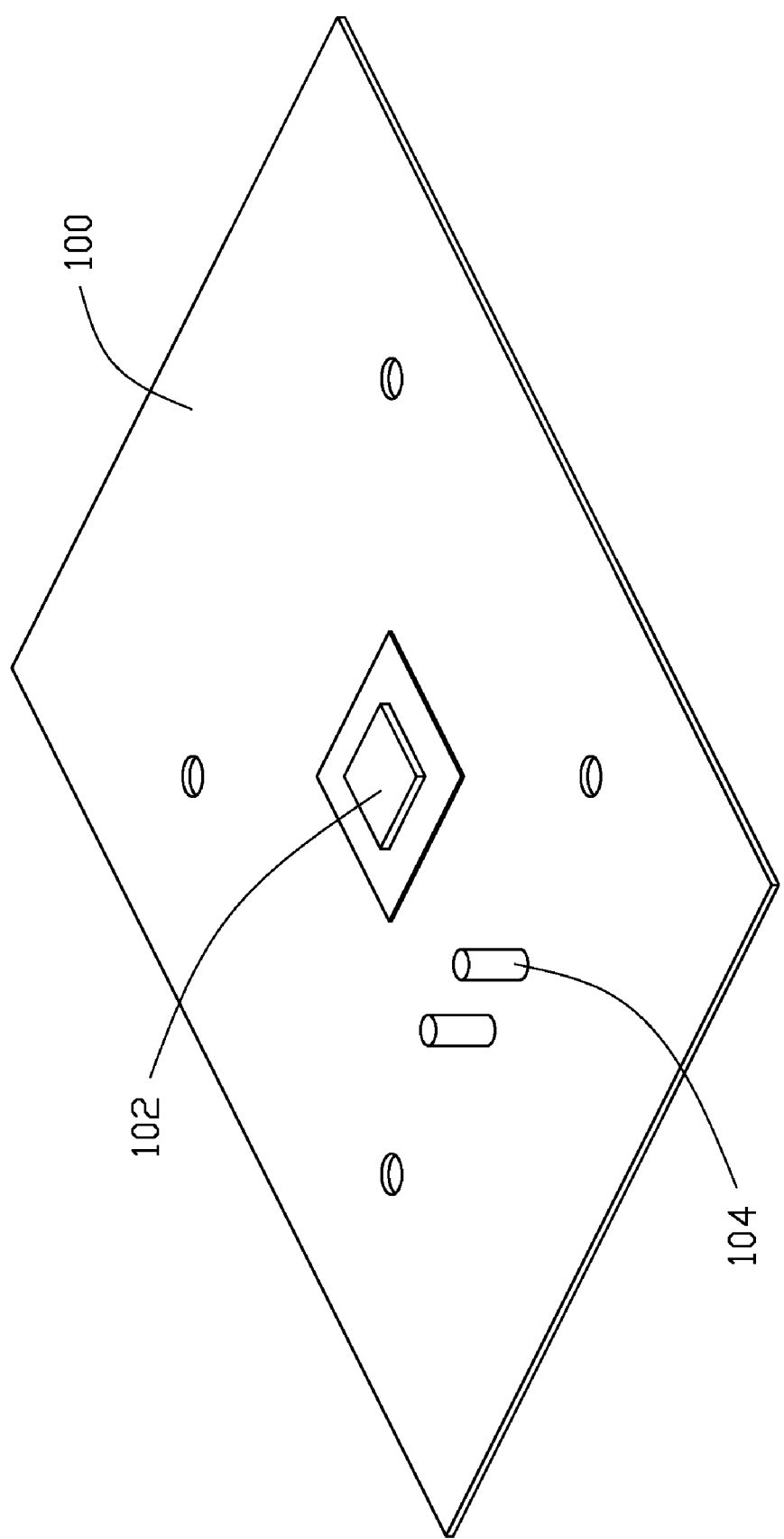
FIG. 1 is an isometric view of a motherboard with heat sources thereon.

The heat sink 10 includes a base 12, a plurality of first heat dissipation fins 14 connected to the base 12, a plurality of second heat dissipation fins 16 connected to the first heat dissipation fins 14, and a plurality of heat dissipating pipes 18 attached to the base 12 below the first heat dissipation fins 14 and extending through the second heat dissipation fins 16. The first heat dissipation fins 14 are perpendicular to the base 12, and the second heat dissipation fins 16 are parallel to the base 12. A bottom surface of the base 15 is configured to contact a first heat source 102, such as a central processing unit (CPU) on a motherboard 100 (See FIG. 1). The heat generated by the first heat source 102 can be transmitted from the base 12 to the second heat dissipation fins 16 via the heat dissipating pipes 18.

The fan 20 is adapted to be attached to the heat sink 10 via the fan bracket 30. The fan 20 can define four through holes 22 at four corners thereof. The fan bracket 30 includes a mounting panel 32 and a pair of L-shaped side flanges 36 perpendicularly extending from two side edges of the mounting panel 32. An airflow opening 38 is defined in the mounting panel 32. Four mounting holes 34 corresponding to the through holes 22 of the fan 20 are defined in the mounting panels 32 for receiving fasteners 24 therein.

The supporting member 40 includes a slim pivotable rod 42, a pair of mounting pieces 46, and a cylinder 44 extending from each of the mounting pieces 46. Each end of the pivotable rod 42 is pivotably engaged in a pivot hole (not shown) of the cylinder 44. A screw hole 461 is defined in each of the mounting pieces 46 and communicates with the pivot hole of the cylinder 44. A pair of securing protrusions 463 is formed on an inner surface of each of the mounting pieces 46. The deflecting plate 60 includes a tilted flange 62, configured to be secured to the pivotable rod 42 of the supporting member 40 by welding, soldering or the like, thereby pivotable together with the pivotable rod 42.

Figure 3:
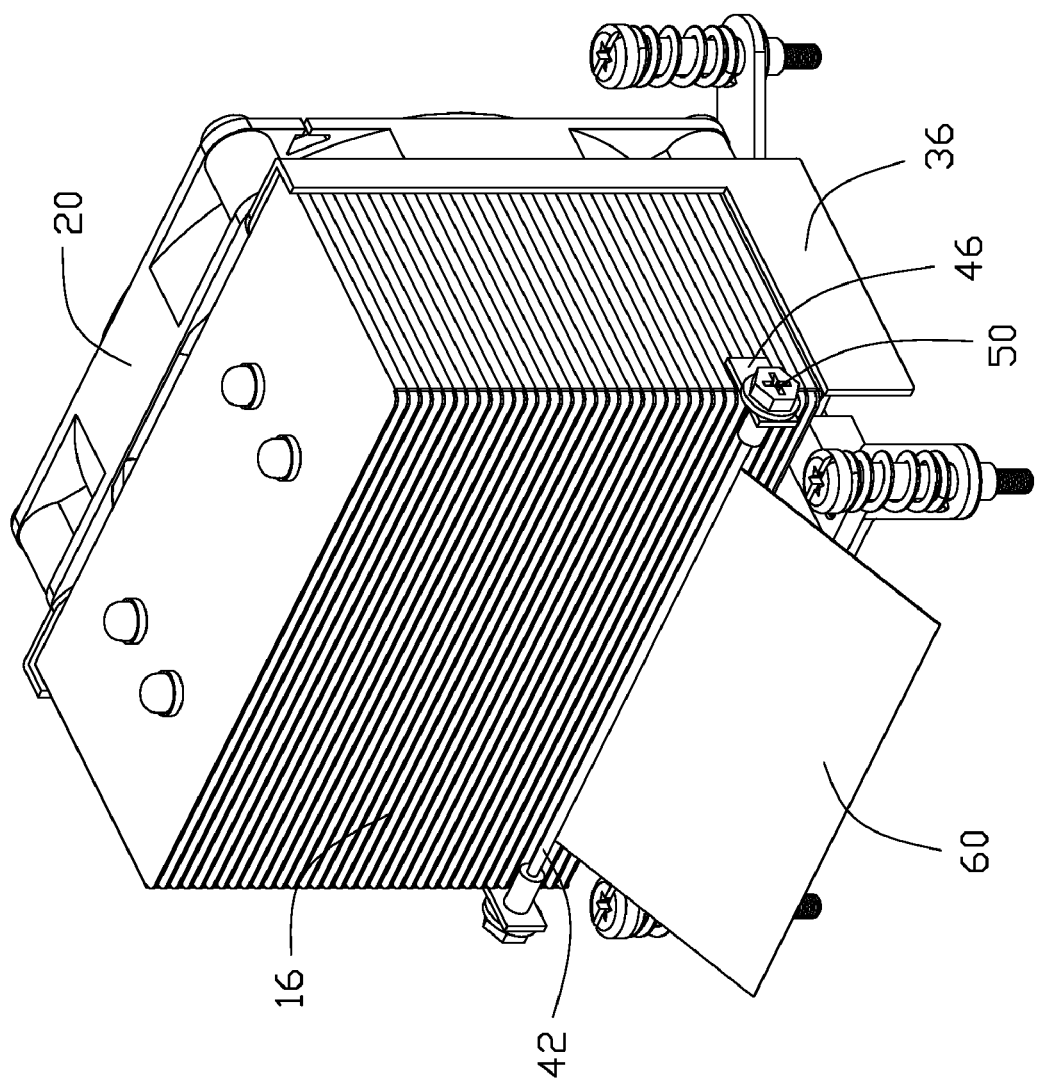
FIG. 3 is an assembled view of the heat dissipation assembly of FIG. 1.

Referring to FIG. 3, in assembly, the side flanges 36 of the fan bracket 30 tightly clamp the second heat dissipation fins 16 of the heat sink 10 to secure the fan bracket 30 to the second heat dissipation fins 16. The fasteners 24 extend through the through holes 22 of the fan 20 and the mounting holes 34 of the fan bracket 30 to secure the fan 22 at one side of the second heat dissipation fins 16 of the heat sink 10. The tilted flange 62 of the deflecting plate 60 is attached to the pivotable rod 42 of the supporting member 40. The mounting pieces 46 of the supporting member 40 are resisting against opposite sides of the second heat dissipation fins 16 of the heat sink 10 and secured to the second heat dissipation fins 16 by adhesive or a fastener, and the securing protrusions 463 of the mounting pieces 46 engage in a gap between two adjacent second heat dissipation fins 16, thereby securing the supporting member 40 at another side of the second heat dissipation fins 16 of the heat sink 10. Then, the fan 20 and the deflecting plate 60 are positioned at opposite sides of the second heat dissipation fins 16 of the heat sink 10. When the deflecting plate 60 rotates to an appropriate angle, a pair of screws 50 can be extended into the screw holes 461 of the mounting pieces 46 of the supporting member 40 and press the ends of the pivotable rod 42, thereby fixing the deflecting plate 60 at the appropriate angle using friction between the screws 50 and the ends of the pivotable rod 42.

In another embodiment, the deflecting plate 60 is fixed at the appropriate angle using friction between the pivotable rod 42 and the cylinder 44.

When the fan 20 rotates, the heat accumulated around the heat sink 10 will be absorbed by airflow from the fan 20. Some of the airflow produced by the fan 20 will pass through the second heat dissipation fins 16 and be deflected by the deflecting plate 60 towards the second heat sources 104 on the motherboard 100 (See FIG. 1) and the first heat dissipation fins 14, thereby dissipating the heat from the second heat sources 104 and accelerating dissipating the heat of the first heat source 102. The efficiency of heat dissipation for the entire motherboard 100 is improved. The deflecting plate 60 is adjustable to a desired angle according to the position of the other heat sources.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation assembly for dissipating heat from a first heat source and a second heat source, the heat dissipation assembly comprising:

a heat sink comprising a base and a plurality of heat dissipation fins, the base contactable with the first heat source for thermally conducting the heat generated by the first heat source;

a fan configured to generate airflow through the plurality of heat dissipation fins in so that the airflow flows from a second side of the plurality of heat dissipation fins to a first side of the plurality of heat dissipation fins;

a supporting member comprising a pair of mounting pieces clamping opposite sides of some of the plurality of heat dissipation fins and a pivotable rod pivotably attached to and located between the pair of mounting pieces; and a deflecting plate attached to the pivotable rod and pivotable relative to the plurality of heat dissipation fins, the deflecting plate capable of deflecting airflow from the fan towards the second heat source to dissipate heat generated by the second heat source;

wherein the plurality of heat dissipation fins are parallel to each other, and each of the plurality of heat dissipation fins is located at a different height relative to the base, and each of the pair of mounting pieces is engageable with different ones of the plurality of heat dissipation fins for mounting the deflecting plate at different heights relative to the base.

2. The heat dissipation assembly of claim 1, wherein a cylinder extends from each of the mounting pieces, the pivotable rod being pivotably engaged with the cylinder.

3. The heat dissipation assembly of claim 2, wherein a screw hole is defined in each of the mounting pieces, a screw extending in the screw hole and compressing one end of the pivotable rod, and the deflecting plate fixed at a desired rotating angle by friction between the end of the pivotable rod and the screw.

4. The heat dissipation assembly of claim 1, wherein the deflecting plate comprises a tilted flange attached to the pivotable rod.

5. The heat dissipation assembly of claim 1, further comprising a fan bracket attached to the heat dissipation fins, wherein the fan bracket comprises a mounting panel mounted on the second side of the heat dissipation fins and a pair of L-shaped side flanges clamping the heat dissipation fins, an airflow opening is defined in the mounting panel, the fan is attached to the mounting panel and generates airflow flowing through the airflow opening towards the heat dissipation fins.

6. The heat dissipation assembly of claim 1, wherein at least one securing protrusion protrudes from an inner surface of each of the pair of mounting pieces along a direction substantially parallel to the base, the at least one securing protrusion engages in a gap between adjacent two of the plurality of heat dissipation fins.

7. The heat dissipation assembly of claim 1, wherein the deflecting plate is pivotable about an axis substantially parallel to each of the plurality of heat dissipation fins.

8. A heat dissipation assembly for dissipating heat from a first heat source and a second heat source comprising:

a heat sink comprising a base for contacting the first heat source, a plurality of first heat dissipation fins disposed on the base, and a plurality of second heat dissipation fins disposed on the first heat dissipation fins, the plurality of first heat dissipation fins substantially perpendicular to the base, the plurality of second heat dissipation fins substantially parallel to the base;

a supporting member comprising a pair of mounting pieces clamping opposite sides of the plurality of second heat dissipation fins, a pivotable rod pivotably attached to and located between the pair of mounting pieces, and at least one securing protrusion protruding from an inner surface of each of the pair of mounting pieces; and a deflecting plate secured to the pivotable rod and installed at a first side of heat sink;

a fan attached to a second side of the heat sink;

wherein the fan generates airflow that flows from the second side of the heat sink to the first side of the heat sink through the second heat dissipation fins and the deflecting plate deflects airflow from the fan towards the second heat source;

the at least one securing protrusion is engageable into a gap between any adjacent two of the plurality second heat dissipation fins to secure the deflecting member at different heights.

9. The heat dissipation assembly of claim 8, wherein a cylinder extends from each of the pair of mounting pieces, the pivotable rod is pivotably engaged with the cylinder.

10. The heat dissipation assembly of claim 8, wherein the first heat dissipation fins are sized smaller than the second heat dissipation fins.

11. The heat dissipation assembly of claim 8, wherein a plurality of heat dissipating pipes is attached to the base and extends through the second heat dissipation fins for dissipating the heat generated by the first heat source.

12. The heat dissipation assembly of claim 8, wherein the first heat source is adjacent to the second heat source and the second heat source is under the deflecting plate.

* * * * *